United States Patent
Chen

(10) Patent No.: US 7,426,250 B2
(45) Date of Patent: Sep. 16, 2008

(54) AUTOMATIC GAIN CONTROLLER AND CONTROLLING METHOD THEREOF

(75) Inventor: Yueh-Chang Chen, Hsinchu County (TW)

(73) Assignee: Winbond Electronics Corp., Hsinchu (TW)

( * ) Notice: Subject to any disclaimer, the term of this patent is extended or adjusted under 35 U.S.C. 154(b) by 1032 days.

(21) Appl. No.: 10/714,771

(22) Filed: Nov. 17, 2003

(65) Prior Publication Data

US 2004/0096018 A1    May 20, 2004

(30) Foreign Application Priority Data

Nov. 18, 2002    (TW) .............................. 91133650 A

(51) Int. Cl.
*H04L 27/08* (2006.01)
(52) U.S. Cl. .................. 375/345; 73/35.05; 73/900; 342/92; 342/392; 348/255; 348/528
(58) Field of Classification Search ............... 375/345; 73/35.05, 931, 900; 342/92, 392; 348/255, 348/528; 367/98, 345; 379/388.03, 390.03; 455/136, 138, 219, 239.1, 240.1, 245.1, 247.1, 455/250.1
See application file for complete search history.

(56) References Cited

U.S. PATENT DOCUMENTS

| | | | | |
|---|---|---|---|---|
| 4,241,454 A * | 12/1980 | Snell et al. ................. | 455/260 |
| 5,654,909 A * | 8/1997 | Sun ............................ | 708/300 |
| 5,673,293 A * | 9/1997 | Scarpa et al. ............... | 375/321 |
| 5,757,858 A * | 5/1998 | Black et al. ................. | 375/295 |
| 6,005,640 A * | 12/1999 | Strolle et al. ................ | 348/726 |
| 6,397,177 B1 * | 5/2002 | Isabelle ...................... | 704/221 |
| 6,580,770 B2 * | 6/2003 | Imanaka et al. ............. | 375/341 |
| 6,836,647 B2 * | 12/2004 | Rimini et al. .............. | 455/226.2 |

* cited by examiner

*Primary Examiner*—David C. Payne
*Assistant Examiner*—Nader Bolourchi
(74) *Attorney, Agent, or Firm*—Volpe and Koenig, P.C.

(57) ABSTRACT

An automatic gain controller and the controlling method thereof are disclosed. The automatic gain controller includes a first multiplexer for receiving an input signal and a gain and generating a first output, a second multiplexer for receiving a signal time constant and a gain time constant and generating a second output, a filter electrically connected to the first multiplexer and the second multiplexer for generating one of a signal-energy and an actual gain in response to the first output and the second output, a signal-energy processing device electrically connected to the filter, the first multiplexer and the second multiplexer for generating the gain and the gain time constant in response to the signal-energy, and a multiplier electrically connected to the filter for multiplying the actual gain by the input signal to generate an output signal.

24 Claims, 6 Drawing Sheets

AUTOMATIC GAIN CONTROLLER AND CONTROLLING METHOD THEREOF

FIELD OF THE INVENTION

The present invention relates to an automatic gain controller, and more particularly to an automatic gain controller having a function of controlling a noise signal and the controlling method thereof.

BACKGROUND OF THE INVENTION

In the voice transmission system, such as the digital enhanced cordless telecommunications (DECT), it is common to have build-in echo canceller to eliminate the echo. Also for those hand free cellular phones, the distance changes between the talker and the phone result in the inconsistent voice volume. To control the volume within the preset values, the automatic gain controller is generally introduced in the voice transmission system for processing the volume control.

Please refer to FIG. 1, which is a block diagram illustrating the circuit of the common voice transmission system. It includes an analog-to-digital converter 11 (ADC), a digital-to-analog converter 18 (DAC), a finite impulse response filter 15 and an automatic gain controller 13 (AGC). Digital signal converted from input analog signals through analog-to-digital converter 11 is multiplied by the first gain 12 and then minus the echo value calculated by the finite impulse response filter 15 so that the signal-energy is obtained. This signal-energy that has been processed by automatic gain controller 13 will be sent to loudspeaker 14. The phenomenon that the phone receiver has inconsistent voice volume could be prevented by such procedure described above. At the transmitter side, the signal received from the microphone 16 is multiplied by the second gain 17 and then is converted into an analog output signal by digital-to-analog converter 18.

Please refer to FIGS. 2a and 2b, which show the waveforms of the signals before and after treated by the automatic gain controller used in common voice transmission system. FIG. 2a shows the waveform at point A in FIG. 1 while FIG. 2b shows the waveform at point B in FIG. 1. As shown in FIG. 2a and FIG. 2b, two levels, an assigned level and a noise level, will be set by the automatic gain controller. The assigned level is the predetermined volume. If the volume is greater than assigned level, it will be diminished by the automatic gain controller. On the contrary, if the volume is less than the assigned level, the volume will then be increased by the automatic gain controller and controlled within the range of the assigned level. For the noise level, the very small volume often considered to be the noise wouldn't be processed.

However, in the practical application, using the fixed-point method to calculate the first gain 12 and second gain 17 may introduce noises. Also the finite impulse response filter 15 might not be able to eliminate echo entirely, that leaves the noise signals with small energy. These noise signals will generate uncomfortable noise if the bit number is not enough for the fix-point calculation.

From the above description, it is known that how to develop a new controller and controlling method with the advantages of low production costs and having the function of noise control has become a major problem waited to be solved. In order to overcome the drawbacks in the prior art, an automatic gain controller and the controlling method thereof are provided. The particular design in the present invention not only solves the problem described above, but also uses a noise level to be one of the controls in the control flow chart of the automatic gain controller for controlling the noise. It only needs simple circuit elements to implement the automatic gain controller of the present invention, and therefore greatly decreases the production costs. Thus, the invention has the utility for the industry.

SUMMARY OF THE INVENTION

It is an object of the present invention to provide an automatic gain controller wherein the volume in noise level has become one of the controls in the control flow chart of the automatic gain controller. While signal-energy is less than or equal to noise level, the gain less than 1 is provided by the automatic gain controller for eliminating the noises.

It is another object of the present invention to provide an automatic gain controller. Two different gain time constants are provided for first gain and second gain in the automatic gain controller of the present invention, so that the system can adjust to different astringent speed according to the demand of system.

It is another object of the present invention to provide an automatic gain controller. In the hardware structure, not many circuit elements are needed to implement the automatic gain controller with the function of eliminating the noises in the present invention. Furthermore, there is no multiplier mounted in the infinite impulse response filter of the automatic gain controller, instead, a shift register is mounted in the infinite impulse response filter. This greatly simplifies the hardware design and decreases the production cost.

In accordance with an aspect of the present invention, an automatic gain controller includes a first multiplexer for receiving an input signal and a gain and generating a first output, a second multiplexer for receiving a signal time constant and a gain time constant and generating a second output, a filter electrically connected to the first multiplexer and the second multiplexer for generating one of a signal-energy and an actual gain in response to the first output and the second output, a signal-energy processing device electrically connected to the filter, the first multiplexer and the second multiplexer for generating the gain and the gain time constant in response to the signal-energy, and a multiplier electrically connected to the filter for multiplying the actual gain by the input signal to generate an output signal.

Preferably, the input signal is a volume signal.

Preferably, the first output and the second output are determined by the first multiplexer and the second multiplexer respectively by means of a level variation at an enabling end.

Preferably, the first output and the second output are the input signal and the signal time constant respectively when the enabling end is at a high level.

Preferably, the first output and the second output are the gain and the gain time constant respectively when the enabling end is at a low level.

Preferably, the automatic gain controller further includes a flip-flop electrically connected to the multiplier for outputting the output signal according to the level at the enabling end.

Preferably, the flip-flop is a D type flip-flop.

Preferably, the filter is an infinite impulse response filter.

Preferably, the filter includes two shift registers.

Preferably, the signal-energy is output by the filter when the first output is the input signal and the second output is the signal time constant.

Preferably, the actual gain is output by the filter when the first output is the gain and the second output is the gain time constant.

Preferably, the signal-energy processing device includes a comparator and a divider.

Preferably, the signal-energy is compared with a predetermined noise level by the signal-energy processing device, a first gain and a first gain time constant are output from the signal-energy processing device if the signal-energy is greater than the noise level, and a second gain and a second gain time constant are output from the signal-energy processing device if the signal-energy is less than or equal to the noise level.

In accordance with another aspect of the present invention, a gain controlling method for processing a signal-energy includes steps of: a) comparing the signal-energy with a predetermined noise level, b) generating a first gain and a first time constant by means of the signal-energy processing device if the signal-energy is greater than the noise level, c) processing the first gain by means of a filter for generating the actual gain, d) generating a second gain and a second time constant by means of the signal-energy processing device if the signal-energy is less than or equal to the noise level, e) processing the second gain by means of a filter for generating the actual gain.

Preferably, the signal-energy processing device includes a comparator and a divider.

Preferably, the first gain is a ratio of a predetermined assigned level to the signal-energy.

Preferably, the second gain is a predetermined value less than or equal to 1.

In accordance with another aspect of the present invention, an automatic gain controller includes a first multiplexer for receiving an input signal and a gain and generating a first output, a second multiplexer for receiving a signal time constant and a gain time constant and generating a second output, a filter electrically connected to the first multiplexer and the second multiplexer for generating one of a signal-energy and an actual gain in response to the first output and the second output, and a signal-energy processing device electrically connected to the filter, the first multiplexer and the second multiplexer for generating the gain and the gain time constant in response to the signal-energy.

Preferably, the automatic gain controller further includes a multiplier electrically connected to the filter for multiplying the actual gain by the input signal to generate an output signal.

Preferably, the filter is an infinite impulse response filter.

Preferably, the filter includes two shift registers.

Preferably, the signal-energy processing device includes a comparator and a divider.

Preferably, the automatic gain controller further includes a flip-flop electrically connected to the multiplier for outputting the output signal according to a level at an enabling end.

In accordance with another aspect of the present invention, a gain controlling method for processing a signal-energy includes steps of: a) comparing the signal-energy with a predetermined noise level, b) generating a first gain and a first time constant by means of the signal-energy processing device if the signal-energy is greater than the noise level, c) generating a second gain and a second time constant by means of the signal-energy processing device if the signal-energy is less than or equal to the noise level.

Preferably, the step b) further includes step b1) processing the first gain by means of a filter for generating the actual gain.

Preferably, the step c) further includes step c1) processing the second gain by means of a filter for generating the actual gain.

Preferably, the first gain is a ratio of a predetermined assigned level to the signal-energy.

Preferably, the second gain is a predetermined value less than or equal to 1.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
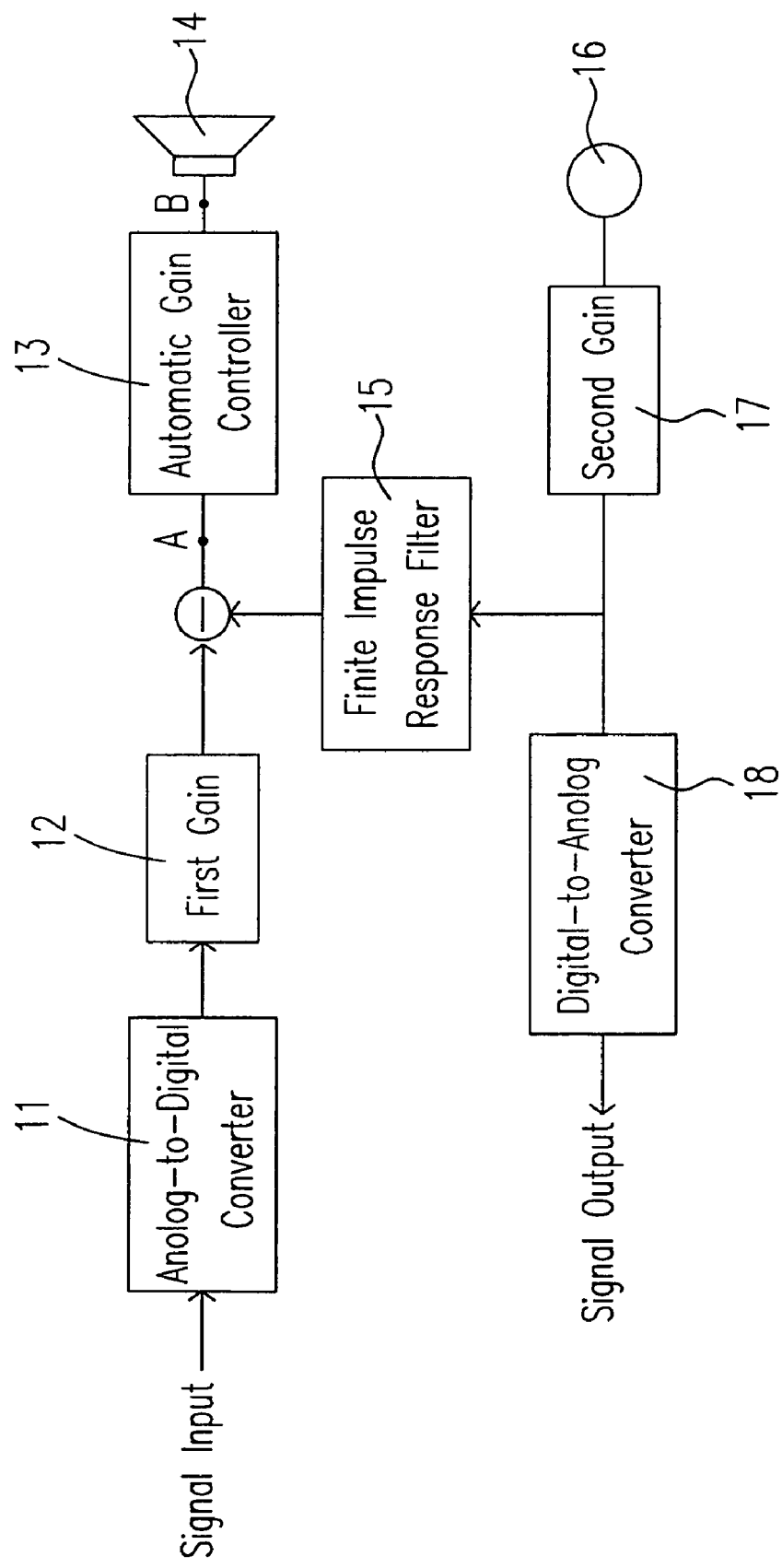
FIG. 1 is a block diagram illustrating the circuit the common voice transmission system according to the prior art.
Figure 2A:
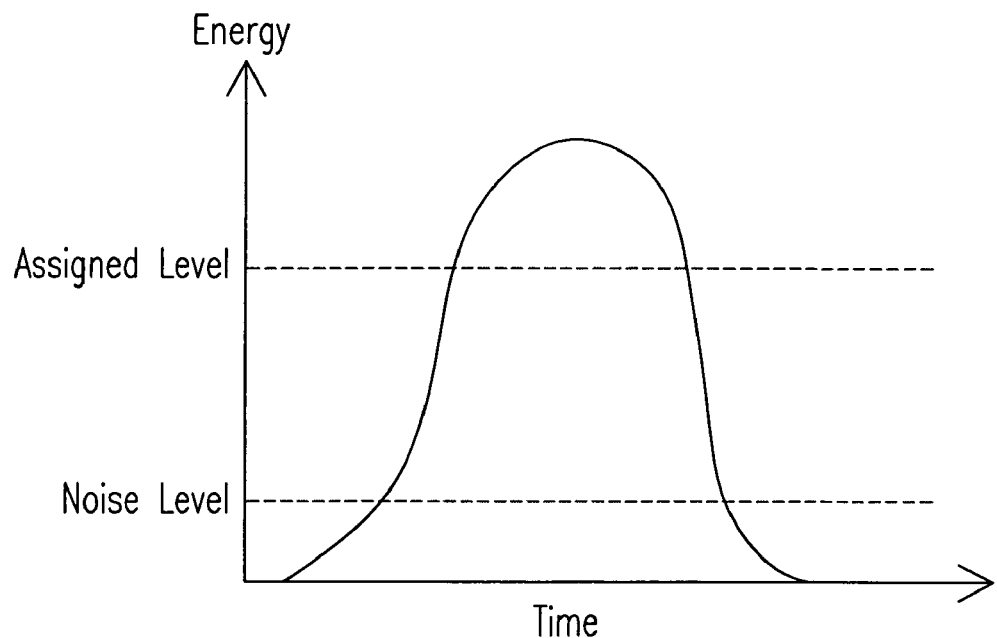
FIGS. 2a and 2b show the waveforms of the signals before and after treated by the automatic gain controller used in common voice transmission system according to the prior art.
Figure 2B:
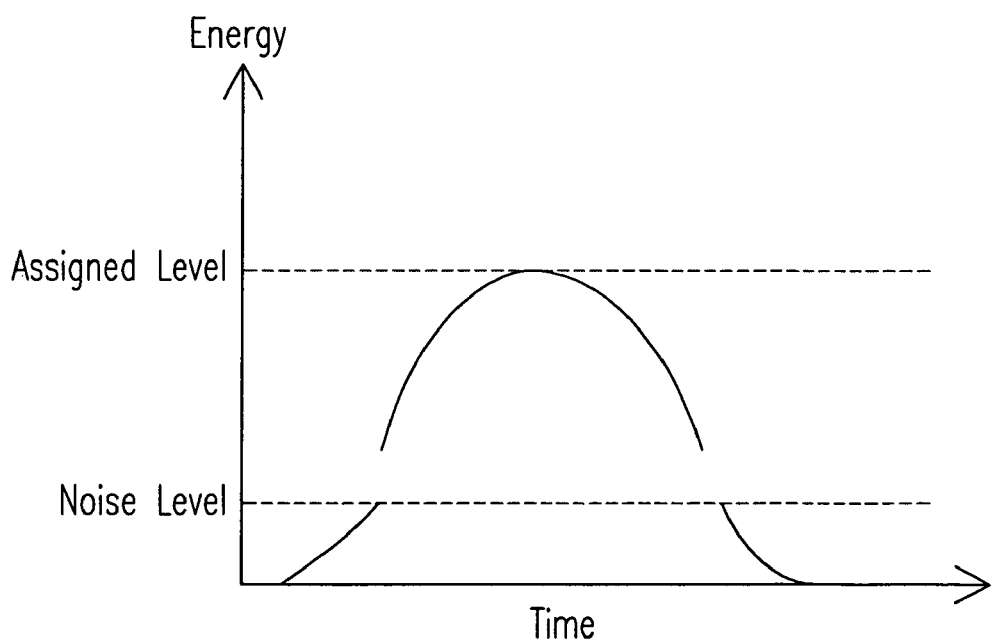
Figure 3A:
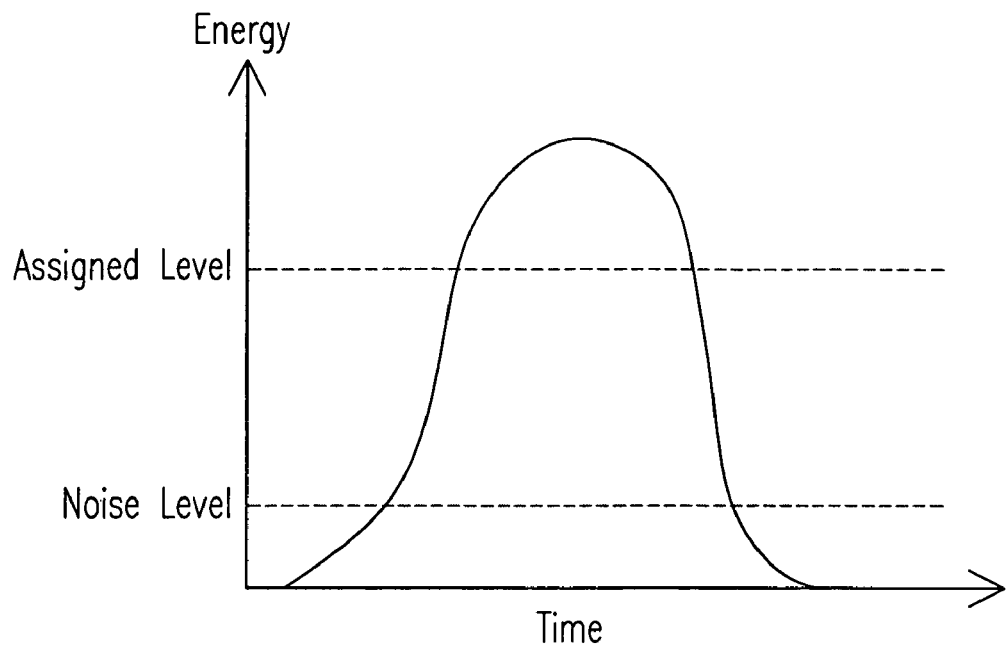
FIGS. 3a and 3b show the waveforms of the signals before and after treated by the automatic gain controller of a preferred embodiment according to the present invention.
Figure 3B:
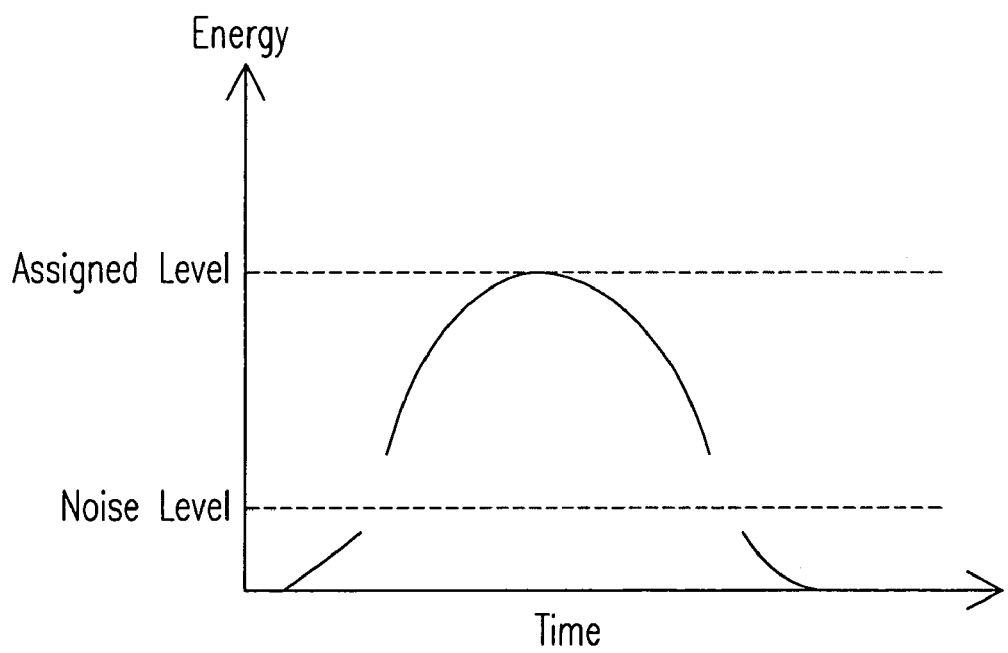

Please refer to FIGS. 3a and 3b, which show the waveforms of the signals before and after treated by the automatic gain controller according to the present invention. In FIGS. 3a and 3b, two levels, assigned level and noise level, will be set by the automatic gain controller. The assigned level is the predetermined volume. The volume will be diminished by the automatic gain controller if it is greater than the assigned level. On the contrary, if the volume is less than the assigned level, it will then be enlarged by the automatic gain controller and controlled within the range of the assigned level. While the volume is less than the noise level, the volume will be reduced to eliminate the noises. That is, the noise signal in the noise level is lowered and inhibited in the automatic gain controller provided in the present invention. That is where the present invention is different from that of the prior art.

Figure 4:
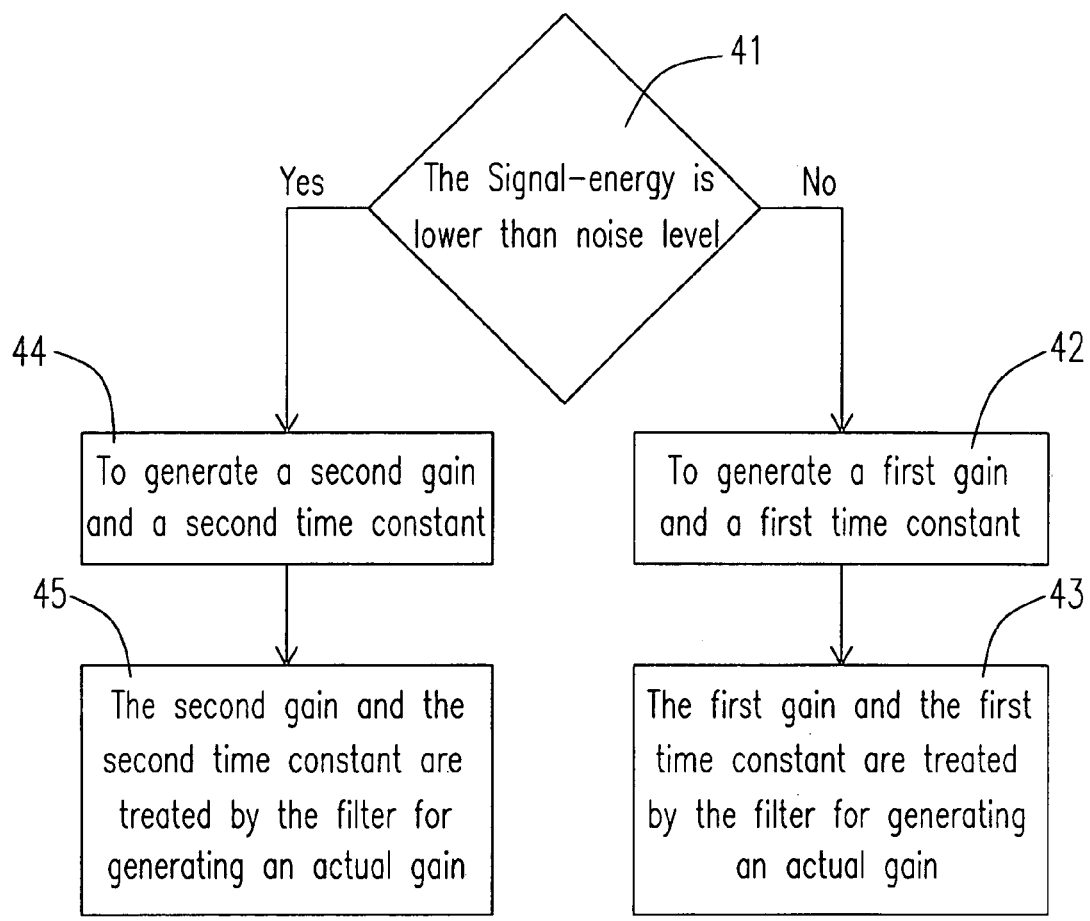
FIG. 4 is the control flow chart of the automatic gain controlling method according to a preferred embodiment of the present invention.

Please refer to FIG. 4, which is the control flow chart of the automatic gain controlling method according to a preferred embodiment of the present invention. For the purpose of eliminating the noises while progressing the voice transmission, the volume signal is transferred into signal-energy which is then compared with a noise level (step 41) according to the gain controlling method of the present invention. If that signal-energy is greater than the noise level, a first gain and a first time constant are generated by the automatic gain controller according to the method of the present invention (step 42). Then the first gain and the first time constant are treated by a low pass filter and thus an actual gain is generated (step 43). Nevertheless, if the signal-energy is less than or equal to noise level, a second gain and a second time constant are generated by the automatic gain controller according to the method of the present invention (step 44). Through processing the second gain and second time constant with the low pass filter, an actual gain is generated (step 45). The function of the low pass filter is to modulate the gains and to prevent the gains from changing suddenly.

The first gain described above is the value obtained by dividing the assigned level by the signal-energy. The second gain is the predetermined value which is less than or equal to 1. The related equations are shown as follows. Equation 1 is the calculation formula for the signal-energy, Equation 2 is the calculation formula for the actual gain when the signal-energy is greater than noise level, and Equation 3 is the calculation formula for the actual gain when the signal-energy is less than or equal to noise level.

$$\text{signal-energy}[n] = \text{signal-energy}[n-1] + |\text{signal}| * 2^{-\text{signal\_time\_const}} - \text{signal-energy}[n-1] * 2^{-\text{signal\_time\_const}} \quad (1)$$

$$\text{actual\_gain}[n] = \text{actual\_gain}[n-1] + |\text{gain}| * 2^{-AGC\_time\_const1} - \text{actual\_gain}[n-1] * 2^{-AGC\_time\_const1} \quad (2)$$

$$\text{actual\_gain}[n] = \text{actual\_gain}[n-1] + |\text{gain}| * 2^{-AGC\_time\_const2} - \text{actual\_gain}[n-1] * 2^{-AGC\_time\_const2} \quad (3)$$

The reason for choosing different time constants in Equation 2 and Equation 3, AGC_time_const1 and AGC_time_const2 respectively, is to let the user define the constant according to the demand of the system and get different convergent speed for each gain.

Figure 5:
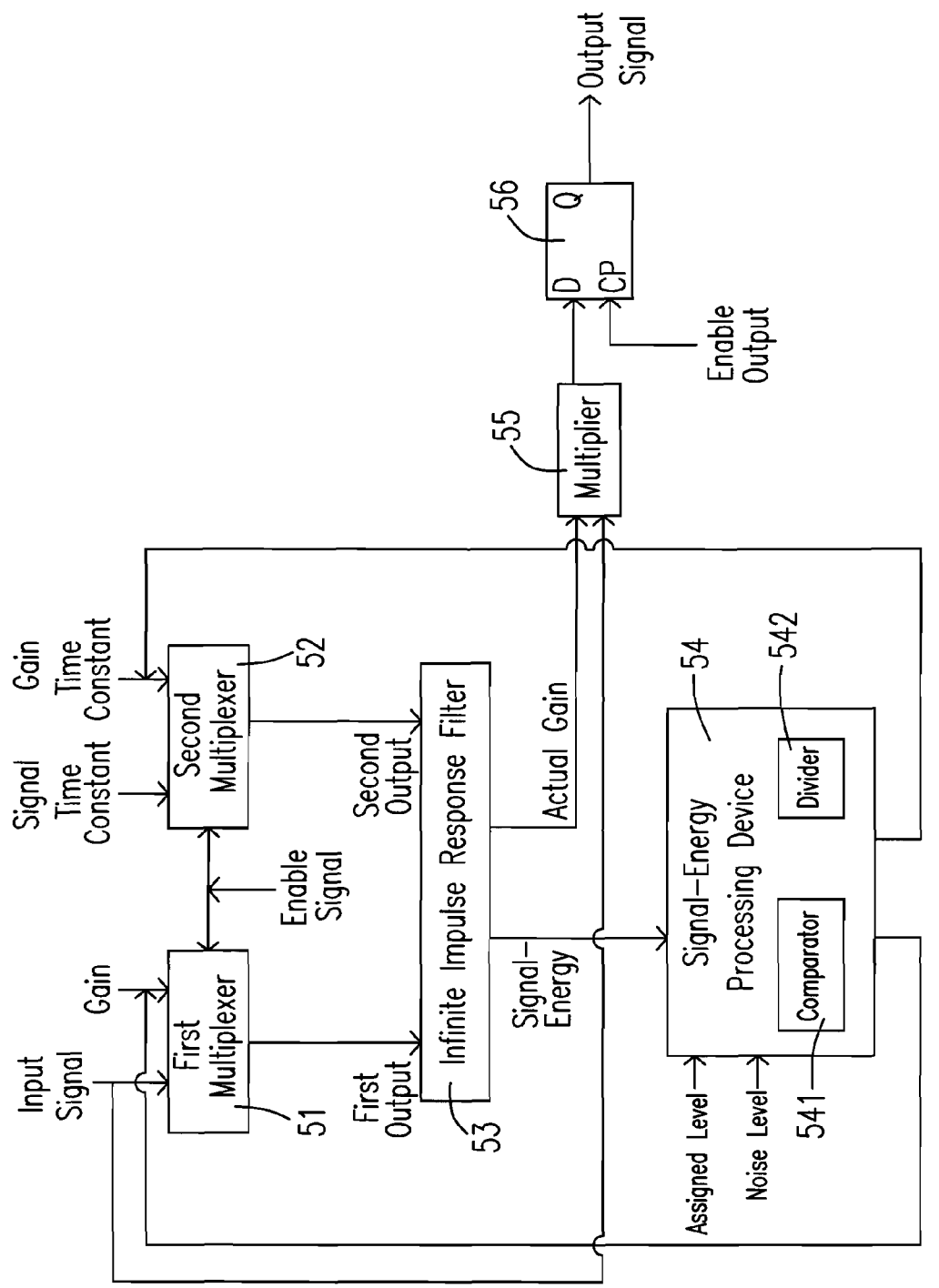
FIG. 5, which is the circuit block diagram of the automatic gain controller according to a preferred embodiment of the present invention.

Please refer to FIG. 5, which shows the circuit block diagram of the automatic gain controller according to a preferred embodiment of the present invention. The structure of the circuit block is designed based on the control flow chart of FIG. 4. The automatic gain controller includes a first multiplexer 51, a second multiplexer 52, an infinite impulse response filter 53, a signal-energy processing device 54, a multiplier 55 and a D type flip-flop 56.

First, an enable signals connected to the first multiplexer 51 and the second multiplexer 52 is set at high level ("1"). The output (first output) generated from the first multiplexer 51 is an input signal, and a signal time constant generated by the second multiplexer 52 is the second output. Then, the input signal and the signal time constant are transmitted to the infinite impulse response filter 53 for performing the calculation process so as to produce a signal-energy. The signal-energy is then sent to the signal-energy processing device 54 which includes a comparator 541 and a divider 542, for further treatment. At this time, the value of noise level is preset at a predetermined volume in the system. If the signal-energy is greater than the noise level value, the first gain and first gain time constant are output by the signal-energy processing device 54 and sent back to the first multiplexer 51 and second multiplexer 52 for the later calculation to obtain the actual gain. On the contrary, if the signal-energy is less than or equal to the noise level value, the second gain and second gain time constant are output by the signal-energy processing device 54 and sent back to the first multiplexer 51 and second multiplexer 52 for the later calculation to obtain the actual gain.

Then, an enable signals connected to the first multiplexer 51 and second multiplexer 52 is set at low level ("0"). A gain (first gain or second gain) is output by the first multiplexer 51, and a gain signal time constant (first gain time constant or second gain time constant) is output by the second multiplexer 52. The gain and the gain signal time constant are transmitted to the infinite impulse response filter 53 for performing the calculation process so as to produce an actual gain. The input signal is multiplied by the actual gain through multiplier 55 for generating an output signal. Finally, the enable output for D type flip-flop 56 is set at high level ("1") and thus the output signal of the multiplier is sent out.

Figure 6:
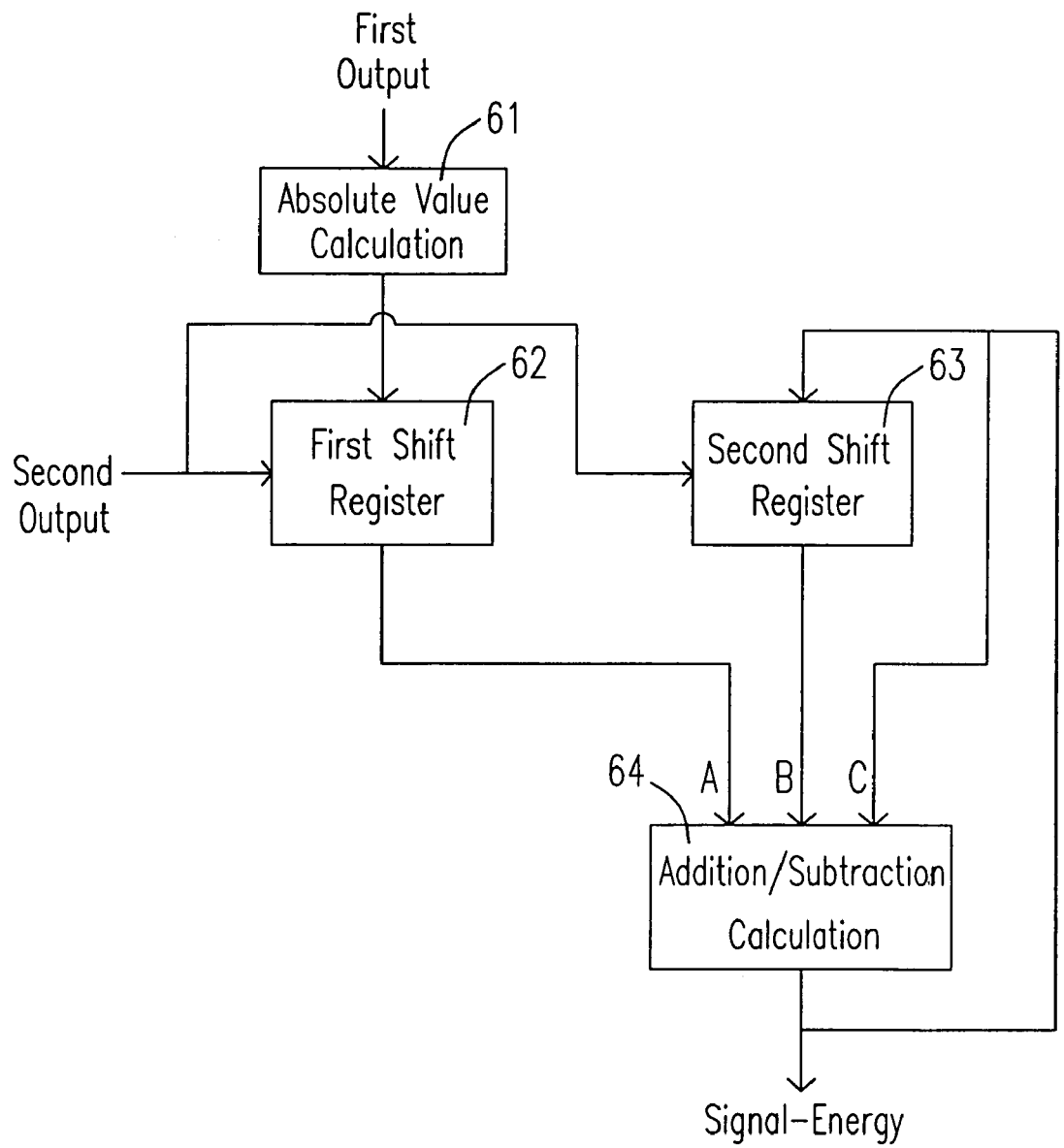
FIG. 6 shows the structure of the infinite impulse response filter according to FIG. 5 of the present invention.

Please refer to FIG. 5 again. The infinite impulse response filter 53 shown in FIG. 5 uses equation (1), (2) and (3) for calculation. As these equations are calculated using quadratic formula, they can be implemented by a shift register. The structure of the infinite impulse response filter 53 is shown in FIG. 6. FIG. 6 shows the structure of the infinite impulse response filter 53 according to FIG. 5. The infinite impulse response filter 53 includes a first shift register 62, a second shift register 63, an absolute value calculation 61 and an addition/subtraction calculation 64. Please refer to FIG. 5 and take equation (1) as an example, if the first output is the input signal and the second output is the signal time constant, then A, B, C can be obtained by the following formulas:

$$A = |\text{signal}| * 2^{-\text{signal\_time\_const}}$$

$$B = \text{signal-energy}[n-1] * 2^{-\text{signal\_time\_const}}$$

$$C = \text{signal-energy}[n-1]$$

After A, B and C are obtained from the above equations, the addition/subtraction calculations 64 are proceeded for generating the signal-energy. The signal-energy can be obtained by the following equations:

$$\text{signal-energy}[n] = A - B + C = \text{signal-energy}[n-1] + |\text{signal}| * 2^{-\text{signal\_time\_const}} - \text{signal-energy}[n-1] * 2^{-\text{signal\_time\_const}}$$

Base on the theory described above, the actual gain can be obtained in the same way by the infinite impulse response filter 53 while the first output is the gain and the second output is the gain time constant.

To sum up above, the automatic gain controller provided in the present invention has the following advantages when compared to the prior art:

1) The control for noise level is added and becomes one of the controls in the control flow chart of automatic gain controller of the present invention. While signal-energy is less than or equal to noise level, the gain less than 1 is provided by the automatic gain controller for eliminating the noises.

2) Two different gain time constants are provided for first gain and second gain by the automatic gain controller of the present invention. Therefore, the system can has different convergent speed for each gain according to the demand of system.

3) In the hardware structure, only some simple circuit elements are needed to implement the automatic gain controller with the function of eliminating the noises in the present invention. Furthermore, there is no multiplier mounted in the infinite impulse response filter in the automatic gain controller of the present invention. Instead, it is a shift register in the infinite impulse response filter. This greatly simplifies the hardware design and decreases the production cost. Therefore, the present invention exhibits industrial application and high commercial value.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An automatic gain controller, comprising:
   a first multiplexer for receiving an input signal and a gain and generating a first output;
   a second multiplexer for receiving a signal time constant and a gain time constant and generating a second output;
   a filter electrically connected to said first multiplexer and said second multiplexer, and generating a signal energy when said signal time constant modulates said input signal and generating an actual gain when said gain time constant modulates said gain in response to said first output and said second output;

a signal-energy processing device electrically connected to said filter, said first multiplexer and said second multiplexer for generating said gain and said gain time constant in response to said signal-energy; and a multiplier electrically connected to said filter for multiplying said actual gain by said input signal to generate an output signal.

2. The automatic gain controller as claimed in claim 1, wherein said input signal is a volume signal.

3. The automatic gain controller as claimed in claim 1, wherein said first output and said second output are determined by said first multiplexer and said second multiplexer respectively by means of a level variation at an enabling end.

4. The automatic gain controller as claimed in claim 3, wherein said first output and said second output are said input signal and said signal time constant respectively when said enabling end is at a high level.

5. The automatic gain controller as claimed in claim 3, wherein said first output and said second output are said gain and said gain time constant respectively when said enabling end is at a low level.

6. The automatic gain controller as claimed in claim 1 further comprising a flip-flop electrically connected to said multiplier for outputting said output signal according to said level at said enabling end.

7. The automatic gain controller as claimed in claim 6, wherein said flip-flop is a D type flip-flop.

8. The automatic gain controller as claimed in claim 1, wherein said filter is an infinite impulse response filter.

9. The automatic gain controller as claimed in claim 8, wherein said filter comprises two shift registers.

10. The automatic gain controller as claimed in claim 8, wherein said signal-energy is output by said filter when said first output is said input signal and said second output is said signal time constant.

11. The automatic gain controller as claimed in claim 8, wherein said actual gain is output by said filter when said first output is said gain and said second output is said gain time constant.

12. The automatic gain controller as claimed in claim 1, wherein said signal-energy processing device comprises a comparator and a divider.

13. The automatic gain controller as claimed in claim 12, wherein said signal-energy is compared with a predetermined noise level by said signal-energy processing device, a first gain and a first gain time constant are output from said signal-energy processing device if said signal-energy is greater than said noise level and a second gain and a second gain time constant are output from said signal-energy processing device if said signal-energy is less than or equal to said noise level.

14. An automatic gain controller, comprising:
a first multiplexer for receiving an input signal and a gain and generating a first output;

a second multiplexer for receiving a signal time constant and a gain time constant and generating a second output;

a filter electrically connected to said first multiplexer and said second multiplexer and generating a signal-energy when said signal time constant modulates said input and generating an actual gain when said gain time constant modulates said gain in response to said first output and said second output; and a signal-energy processing device, electrically connected to said filter, said first multiplexer and said second multiplexer for generating said gain and said gain time constant in response to said signal-energy.

15. The automatic gain controller as claimed in claim 14 further comprising a multiplier electrically connected to said filter for multiplying said actual gain by said input signal to generate an output signal.

16. The automatic gain controller as claimed in claim 15 further comprising a flip-flop electrically connected to said multiplier for outputting said output signal according to a level at an enabling end.

17. The automatic gain controller as claimed in claim 14, wherein said filter is an infinite impulse response filter.

18. The automatic gain controller as claimed in claim 17, wherein said filter comprises two shift registers.

19. The automatic gain controller as claimed in claim 14, wherein said signal-energy processing device comprises a comparator and a divider.

20. A gain controlling method for processing a signal-energy by means of a signal-energy processing device of an automatic gain controller and generating an actual gain in response to said signal-energy, comprising steps of:
   a) comparing said signal-energy with a predetermined noise level;
   b) generating a first gain and a first time constant by means of said signal-energy processing device if said signal-energy is greater than said noise level;
   c) generating a second gain and a second time constant by means of said signal-energy processing device if said signal-energy is less than or equal to said noise level, wherein the actual gain is calculated by an equation of one of said first time constant and said second time constant.

21. The method as claimed in claim 20, wherein said step b) further comprises step b1) processing said first gain by means of a filter for generating said actual gain.

22. The method as claimed in claim 20, wherein said step c) further comprises step c1) processing said second gain by means of a filter for generating said actual gain.

23. The method as claimed in claim 20, wherein said first gain is a ratio of a predetermined assigned level to said signal-energy.

24. The method as claimed in claim 20, wherein said second gain is a predetermined value less than or equal to 1.

* * * * *